(12) United States Patent
Luo et al.

(10) Patent No.: US 7,307,464 B2
(45) Date of Patent: Dec. 11, 2007

(54) SYSTEM AND METHOD FOR SWITCHING BETWEEN HIGH VOLTAGE AND LOW VOLTAGE

(75) Inventors: Wenzhe Luo, Shanghai (CN); Paul Ouyang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/283,061

(22) Filed: Nov. 17, 2005

(65) Prior Publication Data

US 2007/0080742 A1    Apr. 12, 2007

(30) Foreign Application Priority Data

Oct. 12, 2005   (CN)   ................. 2005 1 0030579

(51) Int. Cl.
*H03K 3/01* (2006.01)
(52) U.S. Cl. ....................... 327/534; 327/543
(58) Field of Classification Search ............... None
See application file for complete search history.

(56) References Cited

U.S. PATENT DOCUMENTS 4,703,196 A * 10/1987 Arakawa ................. 327/126
5,422,591 A * 6/1995 Rastegar et al. ............ 327/409
5,426,391 A * 6/1995 Tedrow et al. ............. 327/530
5,757,714 A * 5/1998 Choi et al. ................. 365/226
7,183,837 B2 * 2/2007 Fujiwara .................... 327/537

FOREIGN PATENT DOCUMENTS

JP          55071058 A  *  5/1980

* cited by examiner

*Primary Examiner*—Linh My Nguyen
*Assistant Examiner*—William Hernandez
(74) *Attorney, Agent, or Firm*—Townsend and Townsend and Crew LLP

(57) ABSTRACT

A system and method for providing a voltage. The system includes a first transistor with a first gate, a first terminal, and a second terminal, a second transistor with a second gate, a third terminal, and a fourth terminal, and a third transistor with a third gate, a fifth terminal, and a sixth terminal. Additionally, the system includes a fourth transistor with a fourth gate, a seventh terminal, and an eighth terminal, a fifth transistor with a fifth gate, a ninth terminal, and a tenth terminal, and a sixth transistor with a sixth gate, an eleventh terminal, and a twelfth terminal. The tenth terminal and the eleventh terminal are directly connected at a third node, which is directly connected to a first substrate for the third transistor, a second substrate for the fourth transistor, a third substrate for the fifth transistor, and a fourth substrate for the sixth transistor.

20 Claims, 2 Drawing Sheets

SYSTEM AND METHOD FOR SWITCHING BETWEEN HIGH VOLTAGE AND LOW VOLTAGE

CROSS-REFERENCES TO RELATED APPLICATIONS

This application claims priority to Chinese Patent Application No. 200510030579.7, filed Oct. 12, 2005, commonly assigned, incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK.

Not Applicable

BACKGROUND OF THE INVENTION

The present invention is directed to integrated circuits. More particularly, the invention provides a system and method for switching between high voltage and low voltage. Merely by way of example, the invention has been applied to a memory system. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as a given process, device layout, and/or system design often work down to only a certain feature size.

An example of such a limit is performance of a switch that outputs a high voltage or a low voltage. FIG. 1 is a simplified diagram showing a conventional switch for outputting a high voltage or a low voltage. $V_{PPAA}$ represents a high voltage, and $V_{DDAA}$ represents a low voltage. For example, the high voltage ranges from 6 volts to 25 volts, and the low voltage ranges from 1.8 volts to 5 volts. ENHV#AA represents an enabling signal for the high voltage, and ENLV#AA represents an enabling signal for the low voltage. For example, when, ENHV#AA is at logic low, the high voltage $V_{PPAA}$ is enabled. In another example, when ENLV#AA is at logic low, the low voltage $V_{DDAA}$ is enabled. A level shifter LSH receives ENHV#AA and converts ENHV#AA to ENHV1#AA. The high voltage level of EHNV1#AA is equal to $V_{PP}$. Additionally, transistors MP1 and MP2 are high voltage PMOS transistors.

$V_{PPDDAA}$ is the output voltage generated at a node 110. When ENHV#AA is at the low voltage level, the transistor MP1 is turned on, and the node 110 is connected to a voltage source for the high voltage $V_{PPAA}$. When ENLV#AA is at logic low, the transistor MP2 is turned on, and the node 110 is connected to a node 130 that is coupled to a voltage source for the low voltage $V_{DDAA}$. The substrates of the transistors MP1 and MP2 both are biased to $V_{PPAA}$.

The switch of FIG. 1 has various disadvantages. For example, the node 110 is biased to the high voltage $V_{PPAA}$. When ENLV#AA changes from the high voltage level to the low voltage level, the node 110 is connected to the voltage source for the low voltage $V_{DDAA}$. But the node 110 is previously set at the high voltage $V_{PPAA}$, and this high voltage needs be discharged to $V_{DDAA}$. If the load capacitance is large, the discharge current can be high, which may cause the internal latch-up and/or damage the voltage source for the low voltage $V_{DDAA}$. In another example, for the low-voltage mode, the node 120 cannot be biased to the ground voltage level by adjusting the voltage source for the high voltage $V_{PPAA}$. The voltage level at the node 120 should be at least greater than the level of $V_{DDAA}$ subtracted by the voltage drop of a forward biased PN junction in order to prevent forward biasing the PN junctions for source/drain regions of the transistors MP1 and MP2. $V_{TP}$ is the threshold voltage of the transistors MP1 and MP2.

From the above, it is seen that an improved technique for switching is desired.

BRIEF SUMMARY OF THE INVENTION

The present invention is directed to integrated circuits. More particularly, the invention provides a system and method for switching between high voltage and low voltage. Merely by way of example, the invention has been applied to a memory system. But it would be recognized that the invention has a much broader range of applicability.

In a specific embodiment, the invention provides a system for providing a voltage. The system includes a first transistor including a first gate, a first terminal, and a second terminal. The first terminal is configured to receive a first predetermined voltage, and the first gate is configured to receive a first control signal. Additionally, the system includes a second transistor including a second gate, a third terminal, and a fourth terminal. The second gate is configured to receive a second control signal, the third terminal is biased to a second predetermined voltage, the second terminal and the fourth terminal are directly connected to a first node, and the first node is associated with a first voltage level. Moreover, the system includes a third transistor including a third gate, a fifth terminal, and a sixth terminal. The third gate is configured to receive a third predetermined voltage, and the fifth terminal is directly connected to the first node. Also, the system includes a fourth transistor including a fourth gate, a seventh terminal, and an eighth terminal. The fourth gate is directly connected to the first node, and the eighth terminal are configured to receive the third predetermined voltage. If the first transistor is turned on, the second transistor is turned off. If the first transistor is turned off, the second transistor is turned on. The sixth terminal and the seventh terminal are directly connected to each other at a second node, and the second node is associated with a second voltage level.

According to another embodiment, a system for providing a voltage includes a first transistor including a first gate, a first terminal, and a second terminal. The first terminal is configured to receive a first predetermined voltage, and the first gate is configured to receive a first control signal. Additionally, the system includes a second transistor including a second gate, a third terminal, and a fourth terminal. The second gate is configured to receive a second control signal, the third terminal is biased to a second predetermined voltage, the second terminal and the fourth terminal are directly connected to a first node, and the first node is associated with a first voltage level. Moreover, the system includes a third transistor including a third gate, a fifth terminal, and a sixth terminal. The third gate is configured to receive a third predetermined voltage, and the fifth terminal is directly connected to the first node. Also, the system includes a fourth transistor including a fourth gate, a seventh terminal, and an eighth terminal. The fourth gate is directly connected to the first node, and the eighth terminal is configured to receive the third predetermined voltage. Additionally, the system includes a fifth transistor including a fifth gate, a ninth terminal, and a tenth terminal. The fifth gate is configured to receive the third predetermined voltage, and the ninth terminal is directly connected to the first node. Moreover, the system includes a sixth transistor including a sixth gate, an eleventh terminal, and a twelfth terminal. The sixth gate is directly connected to the first node, and the twelfth terminal is configured to receive the third predetermined voltage. The sixth terminal and the seventh terminal are directly connected to each other at a second node, and the second node is associated with a second voltage level. The tenth terminal and the eleventh terminal are directly connected to each other at a third node, and the third node is directly connected to a first substrate for the third transistor, a second substrate for the fourth transistor, a third substrate for the fifth transistor, and a fourth substrate for the sixth transistor.

According to yet another embodiment, a system for providing a voltage includes a first transistor including a first gate, a first terminal, and a second terminal. The first terminal is configured to receive a first predetermined voltage, and the first gate is configured to receive a first control signal. Additionally, the system includes a second transistor including a second gate, a third terminal, and a fourth terminal. The second gate is configured to receive a second control signal, the third terminal is biased to a second predetermined voltage, and the second terminal and the fourth terminal are directly connected to a first node. Moreover, the system includes a third transistor including a third gate, a fifth terminal, and a sixth terminal. The third gate is configured to receive a third predetermined voltage, and the fifth terminal is directly connected to the first node. Also, the system includes a fourth transistor including a fourth gate, a seventh terminal, and an eighth terminal. The fourth gate is directly connected to the first node, and the eighth terminal is configured to receive the third predetermined voltage. Each of the first transistor and the second transistor is an NMOS transistor. The first control signal is associated with a first logic high level and a first logic low level, and the second control signal is associated with a second logic high level and a second logic low level. If the first control signal is at the first logic high level, the second control signal is at the second logic low level. If the first control signal is at the first logic low level, the second control signal is at the second logic high level. The sixth terminal and the seventh terminal are directly connected to each other at a second node, and the second node is associated with a voltage level.

Many benefits are achieved by way of the present invention over conventional techniques. Some embodiments of the present invention provide an improved switching system for outputting a high voltage or a low voltage. For example, a circuit node is discharged to the ground voltage level when the high voltage is disabled. In another example, a circuit node can be biased to the ground voltage level by adjusting a voltage source for the high voltage. Certain embodiments of the present invention provide a reliable high-voltage/low-voltage multiplexing mechanism. For example, the switching system provides a selected voltage to a memory system without inducing any high-voltage breakdown or latch-up process. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides a system and method for switching between high voltage and low voltage. Merely by way of example, the invention has been applied to a memory system. But it would be recognized that the invention has a much broader range of applicability.

Figure 1:
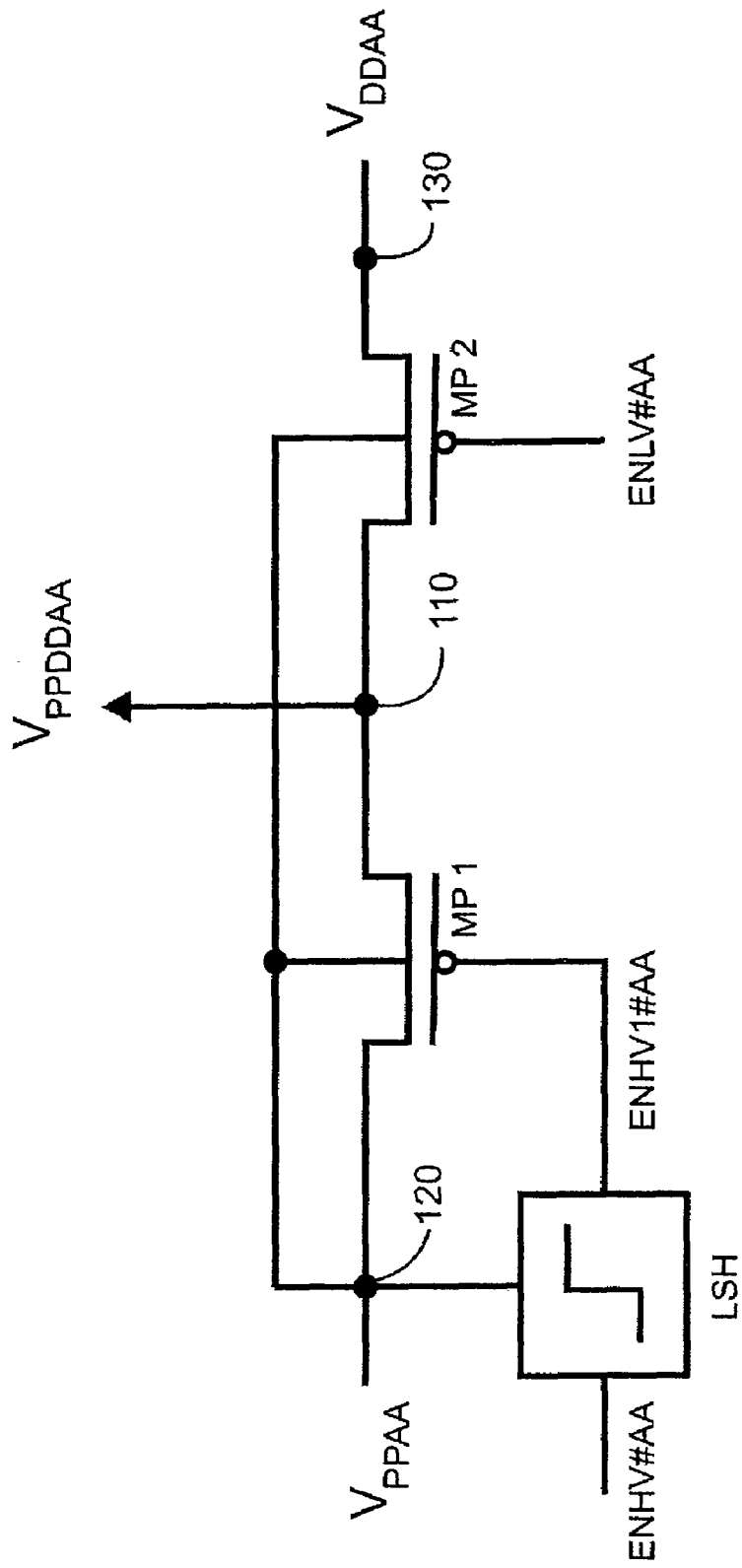
FIG. 1 is a simplified diagram showing a conventional switch for outputting a high voltage or a low voltage.
Figure 2:
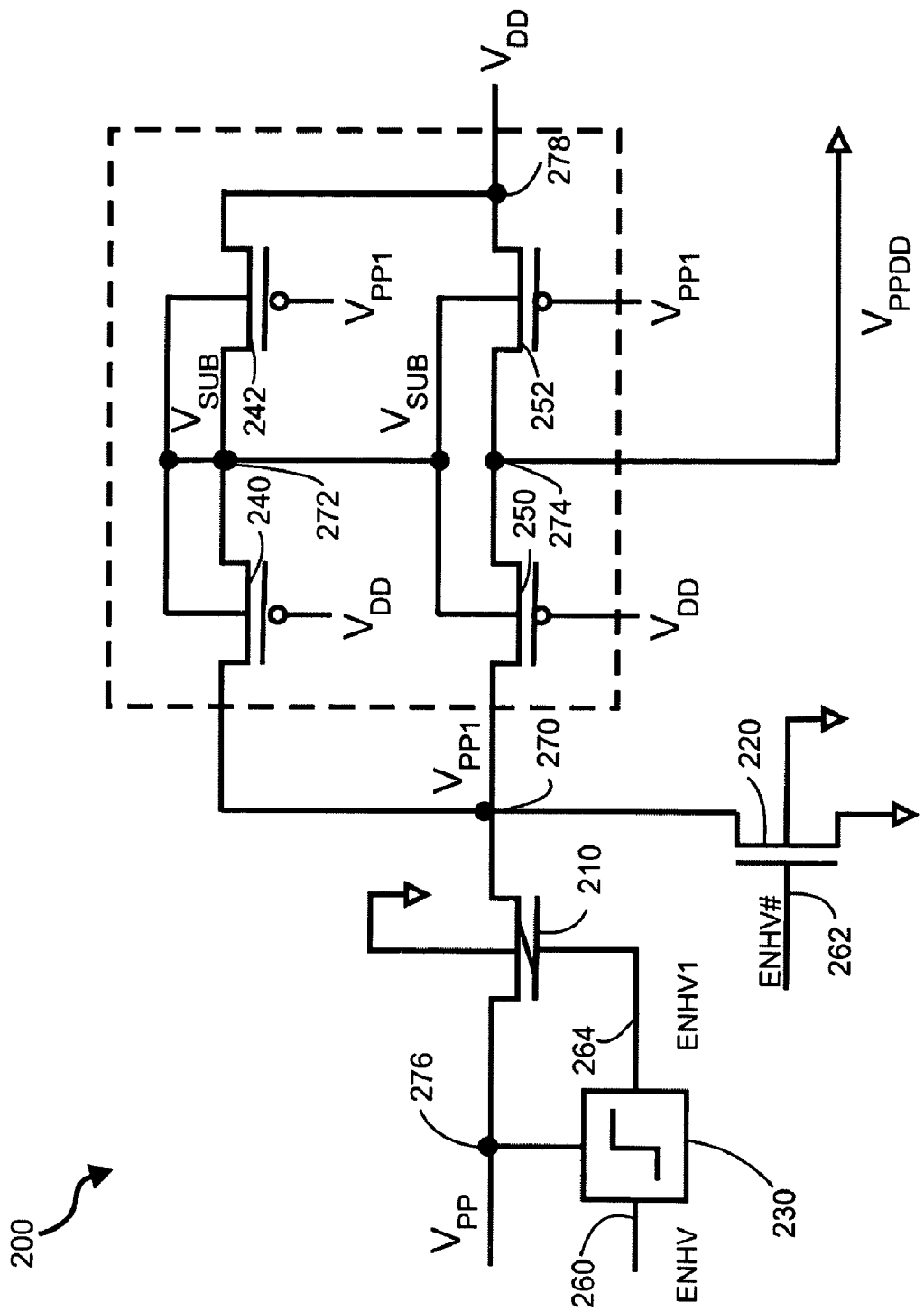
FIG. 2 is a simplified switch for outputting a high voltage or a low voltage according to an embodiment of the present invention.

FIG. 2 is a simplified switch for outputting a high voltage or a low voltage according to an embodiment of the present invention. This diagram is merely an example, which should not unduly limit the scope of the claims. One of ordinary skill in the art would recognize many variations, alternatives, and modifications. The switching system 200 includes the following components:

1. Transistors 210 and 220;
2. Level shifter 230;
3. Transistors 240 and 242;
4. Transistors 250 and 252.

Although the above has been shown using a selected group of components for the switching system 200, there can be many alternatives, modifications, and variations. For example, some of the components may be expanded and/or combined. Other components may be inserted to those noted above. Depending upon the embodiment, the arrangement of components may be interchanged with others replaced. Further details of these components are found throughout the present specification and more particularly below.

$V_{PP}$ represents a high voltage, and $V_{DD}$ represents a low voltage. For example, the high voltage $V_{PP}$ ranges from 6 volts to 25 volts. In another example, the low voltage $V_{DD}$ ranges from 1.8 volts to 5 volts. ENHV represents an enabling signal 260, and ENHV# represents another enabling signal 262. The signals 260 and 262 are complementary to each other. For example, when ENHV is at a logic high voltage level and ENHV# is at a logic low voltage level, the high voltage $V_{PP}$ is enabled and the low voltage $V_{DD}$ is disabled. In another example, when ENHV is at a logic low voltage level and ENHV# is at a logic high voltage level, the high voltage $V_{PP}$ is disabled and the low voltage $V_{DD}$ is enabled.

The level shifter 230 receives the signal 260 and the high voltage $V_{PP}$, and converts the signal 260 to a signal 264 represented by ENHV1. For example, the signal 260 has a logic high voltage level that is equal to the low voltage $V_{DD}$. In another example, the signal 264 has a logic high voltage level that is equal to the high voltage $V_{PP}$. The signal 264 is received by the gate of the transistor 210. For example, the transistor 210 is a high voltage native NMOS transistor. The source/drain of the transistor 210 is biased to the high voltage $V_{PP}$, and the drain/source of the transistor 210 is connected to a node 270. The voltage level at the node 270 is represented by $V_{PP1}$. Additionally, the substrate of the transistor 210 is biased to the ground voltage.

The gate of the transistor 220 receives the signal 262. For example, the transistor 220 is a high voltage NMOS transistor. The source/drain and the substrate of the transistor 220 are biased to the ground voltage. The drain/source of the transistor 220 is connected to the node 270. The gate of the transistor 240 is connected to a node 278 and biased to the low voltage $V_{DD}$, and the gate of the transistor 242 is connected to the node 270 and biased to the voltage level of $V_{PP1}$. For example, the transistors 240 and 242 are high voltage PMOS transistors. The source/drain of the transistor 240 is connected to the node 270, and the source/drain of the transistor 242 is biased to the low voltage $V_{DD}$ through the node 278. The drain/source of the transistor 240 and the drain/source of the transistor 242 are connected to each other at a node 272, whose voltage level is represented by $V_{SUB}$. The substrate of the transistor 240 and the substrate of the transistor 242 are connected to the node 272 and biased to the voltage level $V_{SUB}$.

The gate of the transistor 250 is connected to the node 278 and biased to the low voltage $V_{DD}$, and the gate of the transistor 252 is connected to the node 270 and biased to the voltage level of $V_{PP1}$. For example, the transistors 250 and 252 are high voltage PMOS transistors. The source/drain of the transistor 250 is connected to the node 270, and the source/drain of the transistor 252 is biased to the low voltage $V_{DD}$ through the node 278. The substrate of the transistor 250 and the substrate of the transistor 252 are connected to the node 272 and biased to the voltage level $V_{SUB}$. The drain/source of the transistor 250 and the drain/source of the transistor 252 are connected to each other at a node 274, whose voltage level is represented by $V_{PPDD}$. For example, $V_{PPDD}$ is an output voltage of the switching system 200.

If ENHV is at a logic high voltage level, the level shifter 230 generates ENHV1 at the high voltage $V_{PP}$. For example, ENHV and ENHV1 each are equal to logic high. ENHV1 is received by the gate of the transistor 210. For example, the transistor 210 is a high voltage native NMOS transistor. The transistor 210 is turned on, and the node 270 is biased to:

$$V_{PP1}=V_{PP}-V_{T1}$$ (Equation 1)

where $V_{T1}$ represents the threshold voltage of the transistor 210. For example, $V_{T1}$ ranges from 0.3 volt to 0.8 volt. If ENHV is at a logic high voltage level, ENHV# is at a logic low voltage level. For example, ENHV# is equal to logic low. ENHV# is received by the transistor 220. For example, the transistor 220 is a high voltage NMOS transistor. The transistor 220 is turned off. Since the node 270 is biased according to Equation 1, $V_{PP1}$ is much higher than $V_{DD}$ in one embodiment. The transistors 240 and 250 are turned on, and the transistors 242 and 252 are turned off. At the node 272, $V_{SUB}$ is equal to $V_{PP1}$. At the node 274, $V_{PPDD}$ is equal to $V_{PP1}$, and outputted by the switching system 200.

If ENHV is at a logic low voltage level, the level shifter 230 generates ENHV1 at the ground voltage level. For example, ENHV and ENHV1 each are equal to logic low. ENHV1 is received by the gate of the transistor 210. For example, the transistor 210 is a high voltage native NMOS transistor. The transistor 210 is turned off. If ENHV is at a logic low voltage level, ENHV# is at a logic high voltage level. For example, ENHV# is equal to logic high. ENHV# is received by the transistor 220. For example, the transistor 220 is a high voltage NMOS transistor. The transistor 220 is turned on, and the node 270 is discharged to the ground voltage level. If $V_{PP1}$ is equal to the ground voltage level, the transistors 240 and 250 are turned off, and the transistors 242 and 252 are turned on. At the node 272, $V_{SUB}$ is equal to $V_{DD}$. At the node 274, $V_{PPDD}$ is equal to $V_{DD}$, and outputted by the switching system 200.

As shown in FIG. 2, the transistors 240 and 242 are coupled at the node 272, whose voltage level is represented by $V_{SUB}$. The substrate of each of the transistors 240, 242, 250, and 252 is connected to the node 272 and biased to the voltage level $V_{SUB}$. For example, the transistors 240 and 242 are smaller than the transistors 250 and 252 in width. $V_{SUB}$ is equal to $V_{PP1}$ if ENHV is at a logic high voltage level, and $V_{SUB}$ is equal to $V_{DD}$ if ENHV is at a logic low voltage level. In one embodiment, the node 274 is coupled to another circuit system with high capacitance. It may take a short period of time for the node 274 to switch between the low voltage $V_{DD}$ and the high voltage $V_{PP}$ subtracted by $V_{T1}$. During this transition period, the PN junctions for the source/drain regions of the transistors 250 and 252 may be turned on. In contrast, the node 272 is coupled to the substrate of each of the transistors 240, 242, 250, and 252. The node 272 can be switched more quickly than the node 274 between the low voltage $V_{DD}$ and the high voltage $V_{PP}$ subtracted by $V_{T1}$. The quick switch of $V_{SUB}$ can ensure proper operations of the transistors 240, 242, 250, and 252.

In another embodiment, a node 276 is not used to bias the transistors 250 and 252. When ENHV is at a logic low voltage level, the node 276 can be biased to the ground voltage level by adjusting the voltage source for the high voltage $V_{PP}$. In yet another embodiment, when ENHV changes from a logic high voltage level to a logic low voltage level, the transistor 210 is turned off and the transistor 220 is turned on. The node 270 is discharged to the ground voltage level, but the node 274 is not discharged to the ground voltage level. For example, when the node 270 is discharged to $V_{DD}-|V_{T2}|$, the transistor 252 is turned on, and the node 274 is biased to the low voltage $V_{DD}$. $V_{T2}$ is the threshold voltage of the transistor 252.

As discussed above and further emphasized here, FIG. 2 is merely an example, which should not unduly limit the scope of the claims. One of ordinary skill in the art would recognize many variations, alternatives, and modifications. For example, the transistor 210 is a high voltage PMOS transistor, instead of a native high voltage NMOS transistor. The gate of the transistor 210 receives a signal that is complementary to ENHV1. When ENHV is at a logic high voltage level, the transistor 210 is turned on. The node 270 is charged to $V_{PP}$, which much higher than $V_{DD}$ in one embodiment. The transistors 240 and 250 are turned on, and the transistors 242 and 252 are turned off. At the node 272, $V_{SUB}$ is equal to $V_{PP}$. At the node 274, $V_{PPDD}$ is equal to $V_{PP}$, and outputted by the switching system 200.

According to another embodiment of the present invention, a system for providing a voltage includes a first transistor including a first gate, a first terminal, and a second terminal. The first terminal is configured to receive a first predetermined voltage, and the first gate is configured to receive a first control signal. Additionally, the system includes a second transistor including a second gate, a third terminal, and a fourth terminal. The second gate is configured to receive a second control signal, the third terminal is biased to a second predetermined voltage, the second terminal and the fourth terminal are directly connected to a first node, and the first node is associated with a first voltage level. Moreover, the system includes a third transistor including a third gate, a fifth terminal, and a sixth terminal. The third gate is configured to receive a third predetermined voltage, and the fifth terminal is directly connected to the first node. Also, the system includes a fourth transistor including a fourth gate, a seventh terminal, and an eighth terminal. The fourth gate is directly connected to the first node, and the eighth terminal are configured to receive the third predetermined voltage. If the first transistor is turned on, the second transistor is turned off. If the first transistor is turned off, the second transistor is turned on. The sixth terminal and the seventh terminal are directly connected to each other at a second node, and the second node is associated with a second voltage level. For example, the system is implemented according to the system 200.

According to yet another embodiment of the present invention, a system for providing a voltage includes a first transistor including a first gate, a first terminal, and a second terminal. The first terminal is configured to receive a first predetermined voltage, and the first gate is configured to receive a first control signal. Additionally, the system includes a second transistor including a second gate, a third terminal, and a fourth terminal. The second gate is configured to receive a second control signal, the third terminal is biased to a second predetermined voltage, the second terminal and the fourth terminal are directly connected to a first node, and the first node is associated with a first voltage level. Moreover, the system includes a third transistor including a third gate, a fifth terminal, and a sixth terminal. The third gate is configured to receive a third predetermined voltage, and the fifth terminal is directly connected to the first node. Also, the system includes a fourth transistor including a fourth gate, a seventh terminal, and an eighth terminal. The fourth gate is directly connected to the first node, and the eighth terminal is configured to receive the third predetermined voltage. Additionally, the system includes a fifth transistor including a fifth gate, a ninth terminal, and a tenth terminal. The fifth gate is configured to receive the third predetermined voltage, and the ninth terminal is directly connected to the first node. Moreover, the system includes a sixth transistor including a sixth gate, an eleventh terminal, and a twelfth terminal. The sixth gate is directly connected to the first node, and the twelfth terminal is configured to receive the third predetermined voltage. The sixth terminal and the seventh terminal are directly connected to each other at a second node, and the second node is associated with a second voltage level. The tenth terminal and the eleventh terminal are directly connected to each other at a third node, and the third node is directly connected to a first substrate for the third transistor, a second substrate for the fourth transistor, a third substrate for the fifth transistor, and a fourth substrate for the sixth transistor. For example, the system is implemented according to the system 200.

According to yet another embodiment of the present invention, a system for providing a voltage includes a first transistor including a first gate, a first terminal, and a second terminal. The first terminal is configured to receive a first predetermined voltage, and the first gate is configured to receive a first control signal. Additionally, the system includes a second transistor including a second gate, a third terminal, and a fourth terminal. The second gate is configured to receive a second control signal, the third terminal is biased to a second predetermined voltage, and the second terminal and the fourth terminal are directly connected to a first node. Moreover, the system includes a third transistor including a third gate, a fifth terminal, and a sixth terminal. The third gate is configured to receive a third predetermined voltage, and the fifth terminal is directly connected to the first node. Also, the system includes a fourth transistor including a fourth gate, a seventh terminal, and an eighth terminal. The fourth gate is directly connected to the first node, and the eighth terminal is configured to receive the third predetermined voltage. Each of the first transistor and the second transistor is an NMOS transistor. The first control signal is associated with a first logic high level and a first logic low level, and the second control signal is associated with a second logic high level and a second logic low level. If the first control signal is at the first logic high level, the second control signal is at the second logic low level. If the first control signal is at the first logic low level, the second control signal is at the second logic high level. The sixth terminal and the seventh terminal are directly connected to each other at a second node, and the second node is associated with a voltage level. For example, the system is implemented according to the system 200.

The present invention has various applications. In one embodiment, the switching system 200 is used to provide a low voltage or a high voltage to a memory system. For example, the memory system includes an one-time programmable ROM system, an EEPROM system, and/or a flash memory system. In another example, the memory system uses the high voltage for an erasing and/or writing process, and the memory system uses the low voltage for a reading process.

The present invention has various advantages. Some embodiments of the present invention provide an improved switching system for outputting a high voltage or a low voltage. For example, a circuit node is discharged to the ground voltage level when the high voltage is disabled. In another example, a circuit node can be biased to the ground voltage level by adjusting a voltage source for the high voltage. Certain embodiments of the present invention provide a reliable high-voltage/low-voltage multiplexing mechanism. For example, the switching system provides a selected voltage to a memory system without inducing any high-voltage breakdown or latch-up process.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A system for providing a voltage, the system comprising:
   a first transistor including a first gate, a first terminal, and a second terminal, the first terminal configured to receive a first predetermined voltage, the first gate configured to receive a first control signal;
   a second transistor including a second gate, a third terminal, and a fourth terminal, the second gate configured to receive a second control signal, the third terminal being biased to a second predetermined voltage, the second terminal and the fourth terminal being directly connected to a first node, the first node being associated with a first voltage level;

a third transistor including a third gate, a fifth terminal, and a sixth terminal, the third gate configured to receive a third predetermined voltage, the fifth terminal directly connected to the first node;

a fourth transistor including a fourth gate, a seventh terminal, and an eighth terminal, the fourth gate directly connected to the first node, the eighth terminal configured to receive the third predetermined voltage;

a level shifter configured to receive a third control signal and generate the first control signal;

wherein:

if the first transistor is turned on, the second transistor is turned off;

if the first transistor is turned off, the second transistor is turned on;

the sixth terminal and the seventh terminal are directly connected to each other at a second node;

the second node is associated with a second voltage level.

2. The system of claim 1 wherein:

the first control signal is associated with a first logic high level and a first logic low level;

the second control signal is associated with a second logic high level and a second logic low level.

3. The system of claim 2 wherein:

if the first control signal is at the first logic high level, the second control signal is at the second logic low level;

if the first control signal is at the first logic low level, the second control signal is at the second logic high level.

4. The system of claim 2 wherein the first logic high level is equal to the first predetermined voltage.

5. The system of claim 1 wherein:

the third control signal is associated with a third logic high level and a third logic low level;

the third logic high level is equal to the third predetermined voltage.

6. The system of claim 1 wherein the first transistor is an NMOS transistor or a PMOS transistor.

7. The system of claim 1 wherein the first predetermined voltage is higher than the third predetermined voltage.

8. The system of claim 1 wherein the second predetermined voltage is associated with a ground voltage level.

9. A system for providing a voltage, the system comprising:

a first transistor including a first gate, a first terminal, and a second terminal, the first terminal configured to receive a first predetermined voltage, the first gate configured to receive a first control signal;

a second transistor including a second gate, a third terminal, and a fourth terminal, the second gate configured to receive a second control signal, the third terminal being biased to a second predetermined voltage, the second terminal and the fourth terminal being directly connected to a first node, the first node being associated with a first voltage level;

a third transistor including a third gate, a fifth terminal, and a sixth terminal, the third gate configured to receive a third predetermined voltage, the fifth terminal directly connected to the first node;

a fourth transistor including a fourth gate, a seventh terminal, and an eighth terminal, the fourth gate directly connected to the first node, the eighth terminal configured to receive the third predetermined voltage;

a fifth transistor including a fifth gate, a ninth terminal, and a tenth terminal, the fifth gate configured to receive the third predetermined voltage, the ninth terminal being directly connected to the first node;

a sixth transistor including a sixth gate, an eleventh terminal, and a twelfth terminal, the sixth gate directly connected to the first node, the twelfth terminal configured to receive the third predetermined voltage;

wherein:

if the first transistor is turned on, the second transistor is turned off;

if the first transistor is turned off, the second transistor is turned on;

the sixth terminal and the seventh terminal are directly connected to each other at a second node;

the second node is associated with a second voltage level;

the tenth terminal and the eleventh terminal are directly connected to each other at a third node;

the third node is directly connected to a first substrate for the third transistor, a second substrate for the fourth transistor, a third substrate for the fifth transistor, and a fourth substrate for the sixth transistor.

10. A system for providing a voltage, the system comprising:

a first transistor including a first gate, a first terminal, and a second terminal, the first terminal configured to receive a first predetermined voltage, the first gate configured to receive a first control signal;

a second transistor including a second gate, a third terminal, and a fourth terminal, the second gate configured to receive a second control signal, the third terminal being biased to a second predetermined voltage, the second terminal and the fourth terminal being directly connected to a first node, the first node being associated with a first voltage level;

a third transistor including a third gate, a fifth terminal, and a sixth terminal, the third gate configured to receive a third predetermined voltage, the fifth terminal directly connected to the first node;

a fourth transistor including a fourth gate, a seventh terminal, and an eighth terminal, the fourth gate directly connected to the first node, the eighth terminal configured to receive the third predetermined voltage;

a fifth transistor including a fifth gate, a ninth terminal, and a tenth terminal, the fifth gate configured to receive the third predetermined voltage, the ninth terminal directly connected to the first node;

a sixth transistor including a sixth gate, an eleventh terminal, and a twelfth terminal, the sixth gate directly connected to the first node, the twelfth terminal configured to receive the third predetermined voltage;

wherein:

the sixth terminal and the seventh terminal are directly connected to each other at a second node;

the second node is associated with a second voltage level;

the tenth terminal and the eleventh terminal are directly connected to each other at a third node;

the third node is directly connected to a first substrate for the third transistor, a second substrate for the fourth transistor, a third substrate for the fifth transistor, and a fourth substrate for the sixth transistor.

11. The system of claim 10 wherein:

the first control signal is associated with a first logic high level and a first logic low level;

the second control signal is associated with a second logic high level and a second logic low level.

12. The system of claim 11 wherein:

if the first transistor is turned on, the second transistor is turned off;

if the first transistor is turned off, the second transistor is turned on.

13. The system of claim 11 wherein:
if the first control signal is at the first logic high level, the second control signal is at the second logic low level;
if the first control signal is at the first logic low level, the second control signal is at the second logic high level.

14. The system of claim 11 wherein the first logic high level is equal to the first predetermined voltage.

15. The system of claim 10, and further comprising a level shifter configured to receive a third control signal and generate the first control signal.

16. The system of claim 15 wherein:
the third control signal is associated with a third logic high level and a third logic low level;
the third logic high level is equal to the third predetermined voltage.

17. The system of claim 10 wherein the first transistor is an NMOS transistor or a PMOS transistor.

18. The system of claim 10 wherein the first predetermined voltage is higher than the third predetermined voltage.

19. The system of claim 10 wherein the second predetermined voltage is associated with a ground voltage level.

20. A system for providing a voltage, the system comprising:
a first transistor including a first gate, a first terminal, and a second terminal, the first terminal configured to receive a first predetermined voltage, the first gate configured to receive the first control signal;
a second transistor including a second gate, a third terminal, and a fourth terminal, the second gate configured to receive a second control signal, the third terminal being biased to a second predetermined voltage, the second terminal and the fourth terminal being directly connected to a first node;
a third transistor including a third gate, a fifth terminal, and a sixth terminal, the third gate configured to receive a third predetermined voltage, the fifth terminal directly connected to the first node;
a fourth transistor including a fourth gate, a seventh terminal, and an eighth terminal, the fourth gate directly connected to the first node, the eighth terminal configured to receive the third predetermined voltage;
a fifth transistor including a fifth gate, a ninth terminal, and a tenth terminal, the fifth gate configured to receive the third predetermined voltage, the ninth terminal directly connected to the first node;
a sixth transistor including a sixth gate, an eleventh terminal, and a twelfth terminal, the sixth gate directly connected to the first node, the twelfth terminal configured to receive the third predetermined voltage;

wherein:
each of the first transistor and the second transistor is an NMOS transistor;
the first control signal is associated with a first logic high level and a first logic low level;
the second control signal is associated with a second logic high level and a second logic low level;
if the first control signal is at the first logic high level, the second control signal is at the second logic low level;
if the first control signal is at the first logic low level, the second control signal is at the second logic high level;
the sixth terminal and the seventh terminal are directly connected to each other at a second node;
the second node is associated with a voltage level,
the tenth terminal and the eleventh terminal are directly connected to each other at a third node;
the third node is directly connected to a first substrate for the third transistor, a second substrate for the fourth transistor, a third substrate for the fifth transistor, and a fourth substrate for the sixth transistor.

* * * * *